United States Patent [19]

Miyachi

[11] 3,944,924

[45] Mar. 16, 1976

[54] CITIZENS BAND TRANSCEIVER ASSEMBLY FOR MOUNTING ON A MOTORCYCLE

[75] Inventor: Tatsuro Miyachi, Los Angeles, Calif.

[73] Assignee: Beltek Corporation, Gardena, Calif.

[22] Filed: Aug. 5, 1974

[21] Appl. No.: 494,506

[52] U.S. Cl. .................. 325/16; 280/289; 325/312
[51] Int. Cl.² ......................................... H01B 1/38
[58] Field of Search ............. 325/16, 111, 117, 353, 325/361, 310, 312, 114, 116, 352; 343/713; 280/289; 224/39 R, 30 R

[56] References Cited
UNITED STATES PATENTS

| | | | |
|---|---|---|---|
| 2,490,563 | 12/1949 | Van Gastle | 325/312 |
| 2,980,379 | 4/1961 | Goldfus | 325/312 |
| 3,134,945 | 5/1964 | Wertheimer | 325/312 |

FOREIGN PATENTS OR APPLICATIONS

| | | | |
|---|---|---|---|
| 812,035 | 8/1951 | Germany | 224/30 R |

OTHER PUBLICATIONS

"Cycle World" July 1968, p. 65.

Primary Examiner—Robert L. Griffin
Assistant Examiner—Robert Hearn
Attorney, Agent, or Firm—Keith D. Beecher

[57] ABSTRACT

A citizens band transceiver assembly to be mounted on a motorcycle, or other similar vehicle, is provided which includes a bracket having a continuous tubular member configured to enclose a rectangular area, the bracket further having a base on which the tubular member is mounted, and a plurality of suction cups mounted on the underside of the base to mount the bracket on the top of the gasoline tank of the motorcycle. Belt fasteners are also secured to the base to receive the ends of a belt looped around under the gas tank, and which serves as a further support for the bracket on the motorcycle. A transceiver unit itself is supported on the tubular member by a hook and hand-operated lock which permit the unit to be held securely in place on the bracket, and yet to be readily removed from the bracket, when so desired.

2 Claims, 4 Drawing Figures

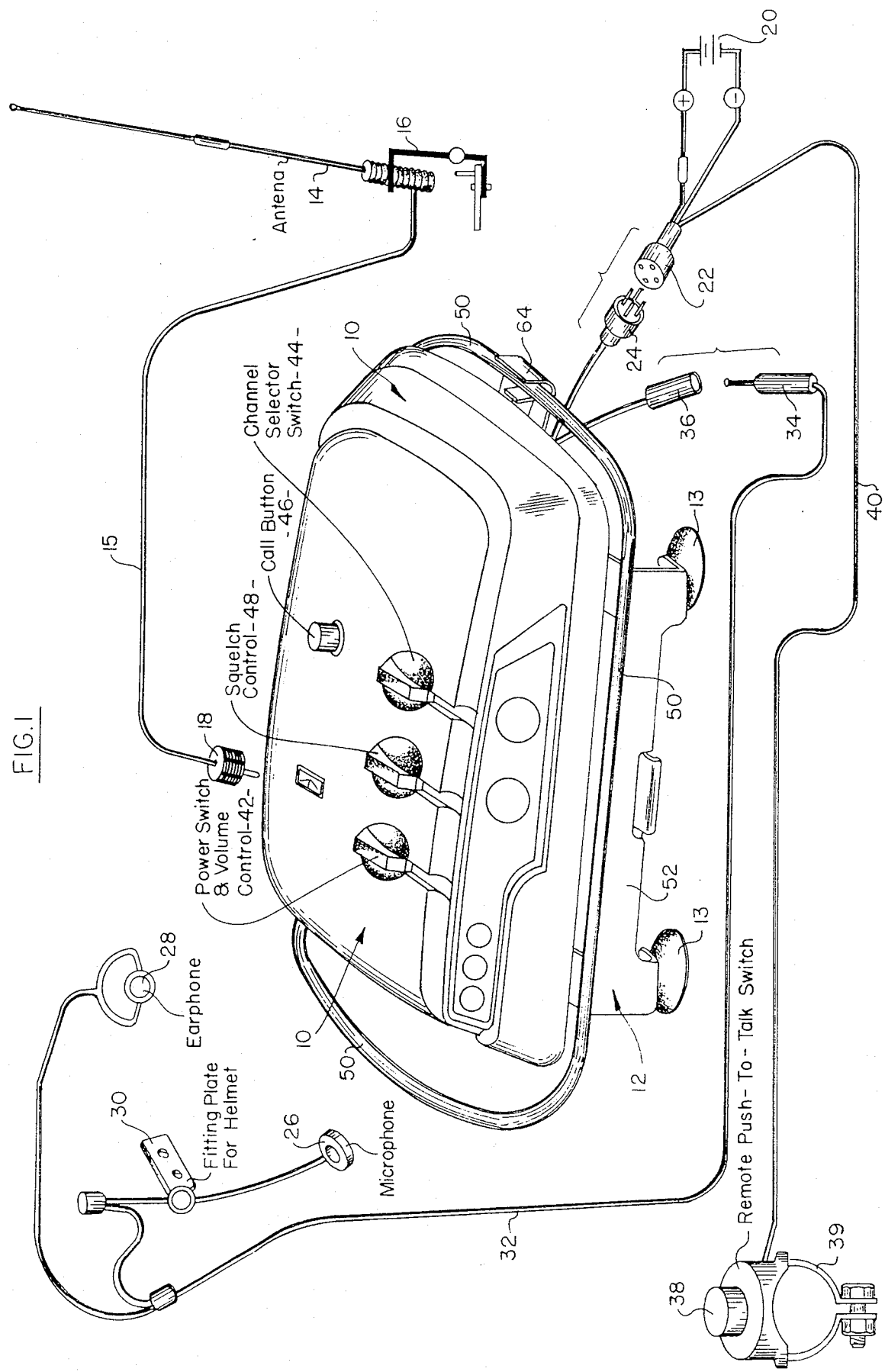

CITIZENS BAND TRANSCEIVER ASSEMBLY FOR MOUNTING ON A MOTORCYCLE

BACKGROUND OF THE INVENTION

Citizens band transceiver communication units have recently been provided for use on motorcycles, and similar vehicles. The present invention provides a simple assembly by which such transceiver units may be conveniently mounted on top of the gas tank of the motorcycle to be in an appropriate position for operation by the rider.

The assembly of the invention serves to hold the transceiver unit firmly and securely in place on the motorcycle without the need for tools or mounting holes. Yet, the transceiver unit may be readily removed from the bracket and the bracket may be easily and readily removed from the gasoline tank. The bracket is mounted in place on the motorcycle gasoline tank, and the citizens band transceiver unit is mounted on the bracket, as mentioned above, without the need for mounting holes, or the like, and without the need for any extraneous tools.

BRIEF DESCRIPTION OF THE DRAWINGS

FIG. 1 is a perspective representation of an assembly constructed in accordance with the invention, including a bracket to be mounted on the gasoline tank of a motorcycle, and a citizens band transceiver unit mounted on the bracket;

DETAILED DESCRIPTION OF THE ILLUSTRATED EMBODIMENT

Figure 3:
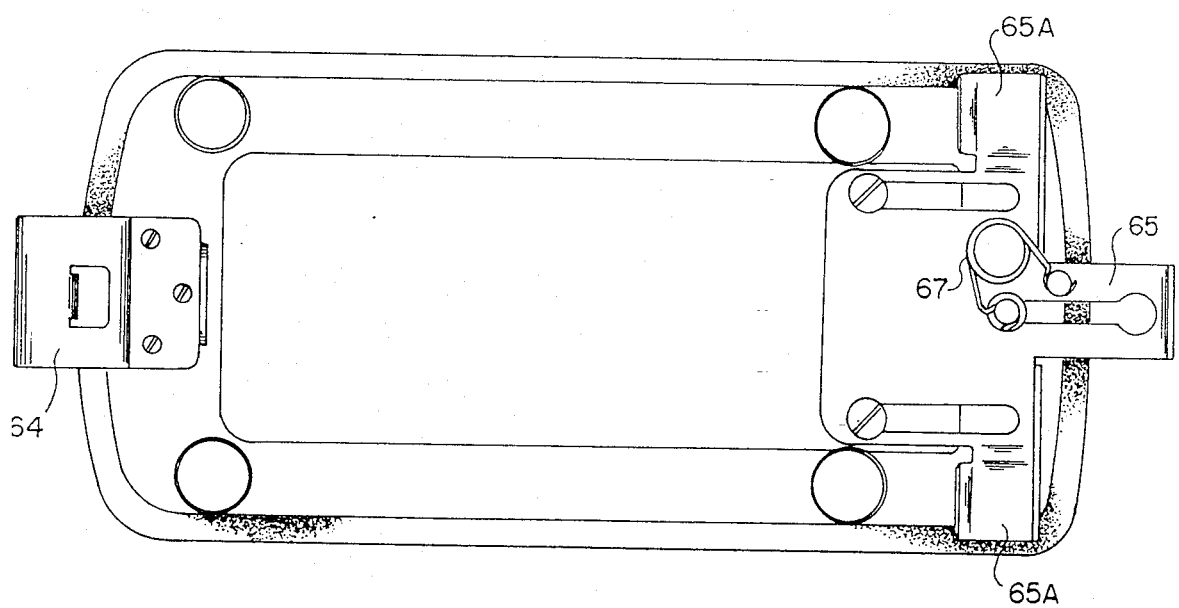
FIG. 3 is a bottom view of the transceiver unit showing the hooks and locks which are used to mount the unit firmly on the bracket of FIG. 2.

The citizens band transceiver unit 10 in FIG. 1 may be mounted on the gasoline tank of a motorcycle by means of a mounting bracket 12, which is attached to the top of the gasoline tank by means of rubber suction cups 13. An antenna 14 is mounted on the motorcycle by means of an appropriate bracket 16, and the antenna is electrically connected to the unit 10 by means of an electric plug 18. The antenna 14 may be a usual type of whip antenna, and it is connected to the plug 18 through a typical leadin conductor 15.

Power for the citizens band transceiver unit may be supplied from a battery 20 which may be the conventional 12-16 volt storage battery incorporated into the motorcycle engine. Power is supplied to the transceiver unit through a plug and socket arrangement 24, 22. A microphone 26 is mounted on the helmet of the rider by means of an appropriate fitting plate 30, the microphone being adjustable with respect to his mouth. An earphone 28 is also mounted in the helmet.

The microphone and earphone are connected to the transceiver unit through an appropriate plug and socket combination 34, 36. A remote push-to-talk switch 38 is mounted on the handlebars of the motorcycle by means of a bracket 39, and the switch may be connected to the transceiver unit through an electrical cable 40, and through the plug and socket combination.

The transceiver unit includes a usual power switch and volume control 42, a channel selector switch 44, a call button 46, and a squelch control 48. The call button 46, when depressed, causes a high frequency signal, in the form of a beep to be transmitted, so as to aprise a receiving station of a call. The squelch control 48 quiets the receiver between calls, and it is rotated by the operator until noise is eliminated in the receiver. The bracket 12 mounts the transceiver unit 10 on the gasoline tank of a motorcycle in an appropriate position for ready operation of the various controls by the rider, and in position for the appropriate mounting of the ancillary components associated with the transceiver unit.

Figure 2:
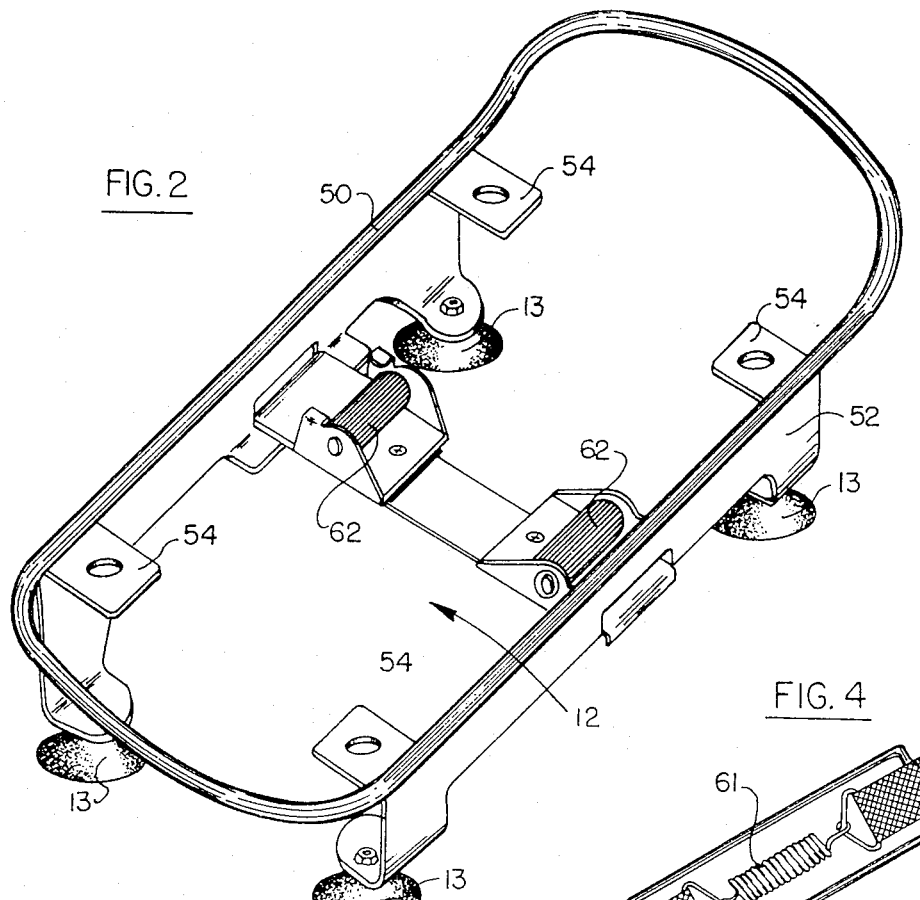
FIG. 2 is a top perspective view of the bracket assembly itself.
Figure 4:
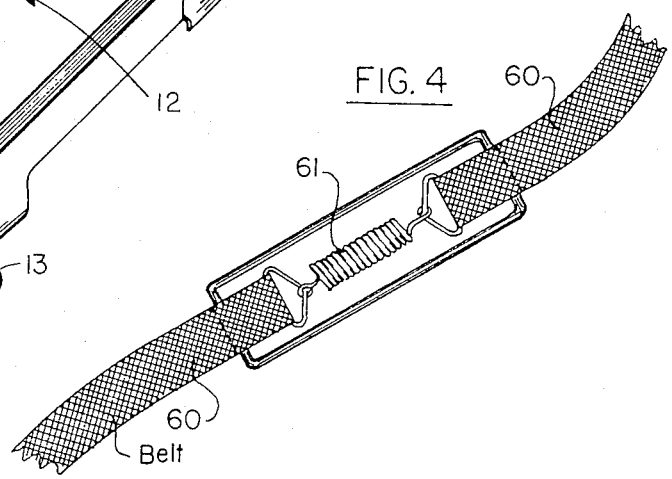
FIG. 4 is a fragmentary view of a belt which serves to hold the bracket securely on the tank of a motorcycle.

The bracket assembly 12 includes a rod-like member 50 which extends around the periphery of the assembly and which is configured to enclose a rectangular area. A base 52 is secured to the tubular member 50 by welding, or other appropriate means, and it defines a pair of sides for the bracket. The transceiver unit 10 is supported on lugs 54 which are secured to the base 52 and which, as shown in FIG. 2, extend inwardly from the sides of the tubular member. The base 52 defines central slots in each side of the bracket for receiving the ends of a belt 60, the ends extending through appropriate belt fasteners 62. The ends may be drawn through the fasteners to tighten the belt 60 securely around the gasoline tank of the motorcycle, so that the belt aids the suction cups 13 in firmly retaining the bracket assembly 12 on the gasoline tank of the motorcycle. The belt 60 includes a spring biased tensioning clamp 61 (FIG. 4).

It will be appreciated that the bracket 12 may be easily and simply removed, merely by releasing the fasteners 62, removing the ends of the belt 60 and by then releasing the suction cups 13. The unit 10 is clipped to the bracket assembly by an appropriate hook 64 and a sliding lock member 65 which are best shown in FIG. 3. The lock member 65 is coupled to an over-center spring 67, or it can be pulled out to an unlocked position to permit the unit 10 to be removed from the bracket 12; or it can be pushed in to a locked position in which the ears 65A of the lock clamp the transceiver unit on the corresponding lugs 54.

To mount the bracket 12 on the gasoline tank of a motorcycle, it is merely necessary to place the bracket on top of the tank, and depress it uniformly by hand so that the vacuum cups 13 can attach themselves to the upper surface of the tank. The belt 60 is then looped around under the tank and its ends inserted into the slots in the sides of the bracket 52, and into the fasteners 62. The ends of the belt can then be pulled tight in the fasteners, so that the belt securely assists the vacuum cups in holding the assembly on top of the gas tank.

The transceiver unit 10 may now be mounted on top of the bracket by hooking the hook 64 under one end of the rod-like member 52 of the mounting bracket and by pressing the unit 10 downwardly, and then pushing the sliding lock 65 inwardly until the unit 10 is firmly secured to the mounting bracket.

The transceiver unit 10 may easily be removed from the bracket 12, merely by pulling out the sliding lock 65 to detach the unit from the bracket. Likewise, the bracket 12 may easily be removed from the motorcycle gasoline tank merely by loosening the fasteners 62, removing the ends of belt 60, and releasing the vacuum cups 13.

The invention provides, therefore, an improved and simplified assembly for mounting a citizens band transceiver unit on the gasoline tank of a motorcycle.

It will be appreciated that although a particular embodiment of the invention has been shown and described, modifications may be made. It is intended in the claims to cover the modifications which come within the spirit and scope of the invention.

What is claimed is:

1. An assembly to be mounted on the gasoline tank, or the like, of a motorcycle, or similar vehicle, said assembly including: a transceiver unit; a bracket including a base defining two sides spaced and essentially parallel to one another, a peripheral rod-like member attached to and surrounding said base and configured to define a rectangular area, a plurality of inwardly-extending lug members mounted on said base for supporting the transceiver unit, and vacuum cups mounted on the underside of the base for securing the assembly to the top of the gasoline tank; and means mounted on said transceiver unit for detachably mounting the unit on the base, said means comprising a hook mounted at one end of the transceiver unit and a slidable lock member mounted on the underside of the transceiver unit at the other end thereof and movable between a locked and an unlocked position, said rod-like member receiving the hook to attach the transceiver to the bracket, and the slidable lock member having side ears positioned to clamp the transceiver unit to the lugs when the lock member is in its locked position.

2. The assembly defined in claim 1, and which includes a belt to be looped around the gasoline tank, and in which the base has slots in the two sides thereof for receiving the ends of the belt; and belt fastener means mounted on said base for receiving and securing the ends of the belt.

* * * * *